(12) United States Patent
Simmons et al.

(10) Patent No.: US 8,326,018 B2
(45) Date of Patent: Dec. 4, 2012

(54) FAST PATTERN MATCHING

(75) Inventors: Mark C Simmons, Wilsonville, OR (US); Oberdan Otto, Camarillo, CA (US)

(73) Assignee: Mentor Graphics Corporation, Wilsonville, OR (US)

(*) Notice: Subject to any disclaimer, the term of this patent is extended or adjusted under 35 U.S.C. 154(b) by 369 days.

(21) Appl. No.: 13/068,838

(22) Filed: May 29, 2010

(65) Prior Publication Data

US 2012/0191729 A1    Jul. 26, 2012

(51) Int. Cl.
*G06K 9/00* (2006.01)
*G06F 17/50* (2006.01)

(52) U.S. Cl. ............... 382/145; 716/50; 716/100

(58) Field of Classification Search ........... 382/141–154
See application file for complete search history.

(56) References Cited

U.S. PATENT DOCUMENTS

| | | | | | |
|---|---|---|---|---|---|
| 4,242,662 | A | * | 12/1980 | Tsujiyama et al. | 382/149 |
| 4,442,542 | A | * | 4/1984 | Lin et al. | 382/147 |
| 4,805,224 | A | * | 2/1989 | Koezuka et al. | 382/141 |
| 4,962,541 | A | * | 10/1990 | Doi et al. | 382/144 |
| 4,979,223 | A | * | 12/1990 | Manns et al. | 382/149 |
| 5,475,766 | A | * | 12/1995 | Tsuchiya et al. | 382/144 |
| 6,154,563 | A | * | 11/2000 | Tsudaka | 382/144 |
| 6,249,900 | B1 | * | 6/2001 | Kotani et al. | 716/55 |
| 6,829,380 | B1 | * | 12/2004 | Choo et al. | 382/144 |
| 6,868,175 | B1 | * | 3/2005 | Yamamoto et al. | 382/145 |
| 6,965,687 | B2 | * | 11/2005 | Sawa et al. | 382/149 |
| 7,526,119 | B2 | * | 4/2009 | Isomura et al. | 382/148 |
| 7,653,892 | B1 | * | 1/2010 | Gennari et al. | 716/50 |
| 7,752,577 | B1 | * | 7/2010 | Gennari et al. | 716/122 |

* cited by examiner

*Primary Examiner* — Manav Seth

(57) ABSTRACT

Aspects of the invention relate to pattern matching of layout design data. Layout design data is searched to identify configurations of geometric elements that match a reference pattern based on an anchor edge in the reference pattern. An edge in a search window area matching the anchor edge may first be selected as anchor matching edge. A search portion of the reference pattern is then compared with the region of the search window area corresponding to the selected anchor matching edge.

20 Claims, 4 Drawing Sheets

FAST PATTERN MATCHING

FIELD OF THE INVENTION

The present invention is directed to the use of pattern matching in electronic design automation. Various aspects of the invention may be particularly useful for applying pattern matching to physical verification and manufacturing preparation processes.

BACKGROUND OF THE INVENTION

Microdevices, such as integrated circuits, are used in a variety of products, from automobiles to microwaves to personal computers. Designing and fabricating integrated circuit devices typically involves many steps, known as a "design flow." The particular steps of a design flow often are dependent upon the type of integrated circuit being designed, its complexity, the design team, and the integrated circuit fabricator or foundry that will manufacture the integrated circuit. Typically, software and hardware "tools" will verify a design at various stages of the design flow by running software simulators and/or hardware emulators, and errors in the design are corrected.

Several steps are common to most design flows. Initially, the specification for the new integrated circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logical of the circuit is then analyzed, to confirm that the logic incorporated into the design will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This logical generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the functions desired for the circuit. This analysis is sometimes referred to as "formal verification."

Once the relationships between circuit devices have been established, the design is again transformed, this time into a physical design that describes specific geometric elements. This type of design often is referred to as a "layout" design. The geometric elements define the shapes that will be created in various materials to actually manufacture the circuit device components (e.g., contacts, gates, etc.) making up the circuit. While the geometric elements are typically polygons, other shapes, such as circular and elliptical shapes, also may be employed. These geometric elements may be custom designed, selected from a library of previously-created designs, or some combination of both. Geometric elements also are added to form the connection lines that will interconnect these circuit devices. Layout tools, such as Mentor Graphics' IC Station or Cadence's Virtuoso, are commonly used for both of these tasks.

With a layout design, each physical layer of the integrated circuit will have a corresponding layer representation, and the geometric elements described in a layer representation will define the relative locations of the circuit device components that will make up a circuit device. Thus, the geometric elements in the representation of an implant layer will define the regions where doping will occur, while the geometric elements in the representation of a metal layer will define the locations in a metal layer where conductive wires used will be formed to connect the circuit devices. Typically, a designer will perform a number of analyses on the layout design. For example, the layout design may be analyzed to confirm that it accurately represents the circuit devices and their relationships described in the device design. The layout design also may be analyzed to confirm that it complies with various design requirements, such as minimum spacings between geometric elements. Still further, it may be modified to include the use of redundant or other compensatory geometric elements intended to counteract limitations in the manufacturing process, etc. After the layout design has been finalized, then it is converted into a format that can be employed by a mask or reticle writing tool to create a mask or reticle for use in a photolithographic manufacturing process.

Some of these physical verification processes are based on one simple concept: certain geometric shapes cannot be successfully manufactured with a given manufacturing process. Historically, a chip manufacturer would have a failure analysis (FA) team identify these configurations, generate a geometric representation of the problematic features in those configurations, and then derive an engineering specification for excluding those problematic features from new designs. This type of engineering specification typically would be interpreted and formulated as a design rule. The derived design rule would then be added to the rule decks for use during a physical verification process.

The above design rule checking (DRC) process worked well when most problem features could be defined with simple one-dimensional checks (length, width, distance, etc.). However, as the microdevice manufacturing industry reached the advanced nodes of the nanometer era, shapes became more complex, and the interactions between design features became multi-dimensional. Some configurations are now so complex they cannot be accurately described with existing scripting languages, inevitably resulting in checking errors. Additionally, significant time and expertise must be spent in the attempt to reach congruence between the original intent of the design rule and its implementation in a DRC process. Moreover, as advanced nodes are being implemented, problematic configurations or patterns are now being identified by designers using lithography and optical process simulations well before silicon production and the creation of design rules. These designers also need the ability to capture and transfer problematic configurations to other designers.

Using the original visual representation of a configuration rather than the abstraction and derivation can dramatically simplify the process of defining and transferring information about a problematic configuration in a layout design to a designer. Pattern matching can also reduce runtimes for simulation by targeting specific configurations within a design, allowing a designer to focus simulation resources on those configurations. Therefore, pattern matching (or pattern detection) is becoming a widely used approach in today's semiconductor industry. Accordingly, the industry is continuously seeking techniques for improving the efficiency of or reducing the process time of pattern matching.

BRIEF SUMMARY OF THE INVENTION

Aspects of the invention relate to pattern matching of layout design data. With various implementations of the invention, layout design data is searched to identify configurations of geometric elements that match a reference pattern. The reference pattern may be, for example, selected from a library of geometric element configurations previously identified as problematic to manufacture during a lithograph manufacturing process. Initially, an edge in the reference pattern is selected as an anchor edge. The anchor edge may be selected, for example, as the edge in the library pattern having the fewest number of matching edges in the region of the layout design being searched (i.e., the search window area). After the anchor edge is selected, an edge in the search window area matching the anchor edge (i.e., an anchor matching edge) is selected. A search portion of the reference pattern then is compared with the region of the search window area corresponding to the selected anchor matching edge. With various examples of the invention, the search portion of the reference pattern (i.e., the reference pattern search portion) may include the entirety of the reference pattern, or it may be only a subset of the reference pattern. The reference pattern search portion clips effectively clips any edges in the search window area extending beyond the boundary of the reference pattern search portion, and creates virtual edges along the boundary of the reference pattern search portion. The boundary of the reference pattern search portion is referred to as "extent." Thus, the extent of the reference pattern search portion defines the features in the search window area in the design (i.e., the design pattern) to be compared with the reference pattern to determine a match.

With various examples of the invention, a preliminary check is made to compare the number of edges in the design pattern with the number of edges in the pattern search portion to determine whether further pattern matching processing is warranted. As will be appreciated by those of ordinary skill in the art, the numbers and types of edges will be the same if the design pattern matches the pattern search portion. If the edge counts agree, then an additional comparison of the vertices and edge features are checked in detail to determine whether all conditions for a pattern match are satisfied. This process is then repeated for each anchor matching edge in the search window area. Upon locating a matching design pattern, a marker may be oriented and placed corresponding to the location of the matching design pattern.

With various implementations of the invention, multiple search window areas may be searched for design patterns that match the reference pattern search portion. According to some implementations of the invention, a different anchor edge may be selected for different search window areas, because the anchor edge is chosen based on the number of edge matches found in a specific search window area.

DETAILED DESCRIPTION OF THE INVENTION

Various aspects of the present invention relate to pattern matching of layout design data for physical verification. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate" and "determine" to describe the disclosed methods. Such terms are high-level abstractions of the actual operations that are performed. The actual operations that correspond to these terms will vary depending on the particular implementation and are readily discernible by one of ordinary skill in the art.

Operating Environment

Figure 1:
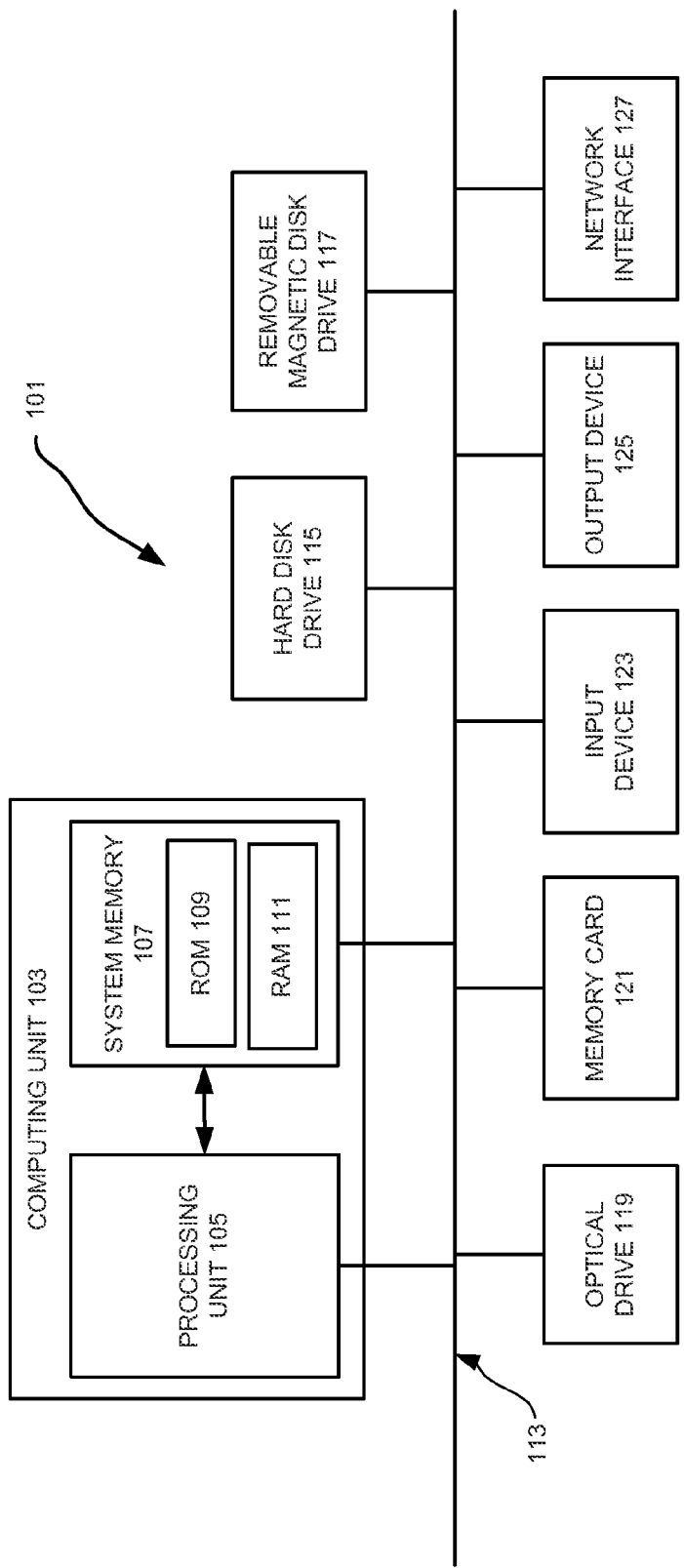
FIG. 1 illustrates a programmable computer system with which various embodiments of the invention may be employed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Pattern Matching Tool

Figure 2:
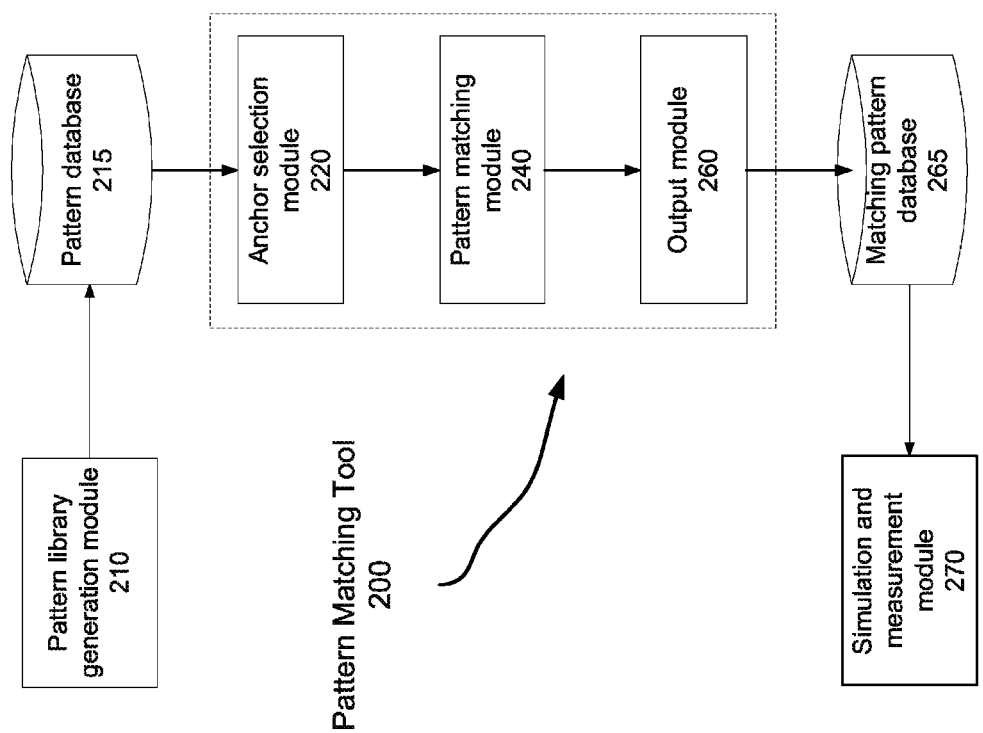
FIG. 2 illustrates a pattern matching tool that may be implemented according to various embodiments of the invention.

FIG. 2 illustrates an example of a pattern matching tool 200 that may be implemented according to various embodiments of the invention. As seen in the figure, the pattern matching tool 200 includes an anchor selection module 220, a pattern matching module 240 and an output module 260. As also shown in this figure, various implementations of the pattern matching tool 200 may cooperate with (or incorporate, in whole or part) a pattern library generation module 210, a pattern database 215, a matching pattern database 265 and a simulation and measurement module 270.

As will be discussed in detail below, the pattern matching tool 200 performs a pattern matching process on a layout design. As used herein, the term "design" is intended to encompass data describing an entire device, such as an integrated circuit device or micro-electromechanical system (MEMS) device. This term also is intended to encompass a smaller group of data describing one or more components of an entire device, however, such as a layer of an integrated circuit device, or even a portion of a layer of an integrated circuit device. Still further, the term "design" also is intended to encompass data describing more than one device, such as data to be used to create a mask or reticle for simultaneously forming multiple devices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

The pattern database 215 supplies a reference pattern (or library pattern) for detection. The anchor selection module 220 determines an anchor edge for the reference pattern based on information regarding the number of matching edges found in the search window area of the layout design. The edges in the search window area that match the anchor edge are denoted as anchor matching edges. The pattern matching module 240 searches for design patterns that match the reference pattern search portion near the locations of these anchor matching edges. When a matching design pattern is found, the output module 260 provides location information of the matching design pattern. The matching pattern database 265 then may be used to store the location information. With some implementations of the invention, the simulation and measurement module 270 performs localized simulation and/or measurements on the matching design pattern.

The reference patterns stored in the pattern database 215 for pattern matching may be obtained in many ways. For example, with some implementations of the invention, a user may provide reference patterns for detection. In some embodiments of the invention, the pattern library generation module 210 alternately or additionally may be used. The module 210 may be configured according to a user's applications. For example, the module 210 may be configured to generate library patterns describing problematic topological configurations ("hot spots") which will negatively impact yield during manufacturing. By using these reference patterns, the pattern matching tool 200 can thus detect hot spots in a layout design.

As previously noted, various embodiments of the invention may be implemented by a computing system, such as the computing system illustrated in FIG. 1. Accordingly, one or more components of each of the anchor selection module 220, the pattern matching module 240 and the output module 260 may be implemented using one or more processors in a computing system. It should be appreciated that, while these three modules are shown as separate units in FIG. 2, a single computer (or a single process in a computing system) may be used to implement two or more of these modules at different times. Also, various examples of the invention may be embodied by software-executable instructions, stored on a tangible computer-readable medium, for instructing a computing system to implement one or more components of each of the anchor selection module 220, the pattern matching module 240 and the output module 260. Further, while the pattern database 215 and the matching pattern database 265 are shown as separate units in FIG. 2, a single computer accessible medium may be used to implement these databases.

Pattern Matching

Figure 3:
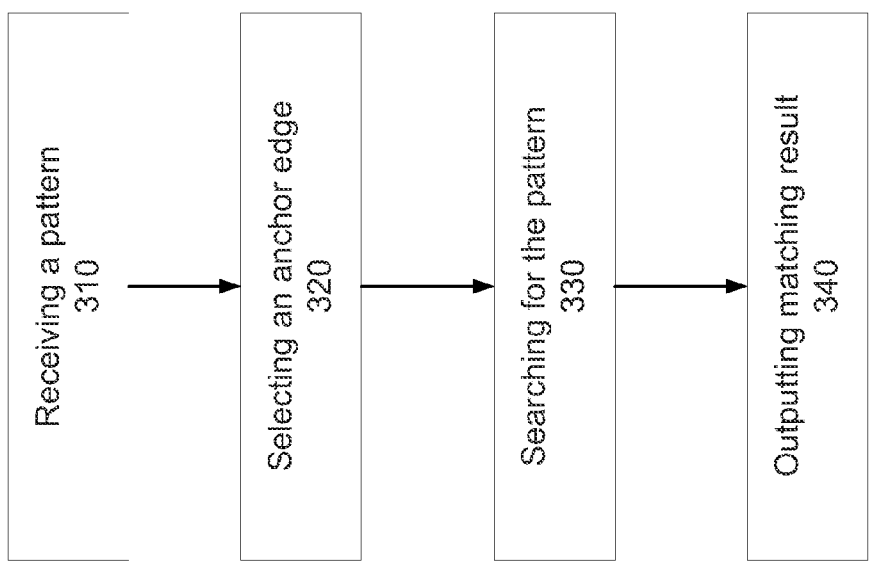
FIG. 3 illustrates a flowchart for a pattern matching method according to various embodiments of the invention.

FIG. 3 illustrates a flowchart describing methods of pattern matching according to various embodiments of the invention. For purposes of explanation, various methods described in FIG. 3 will be discussed with reference to the pattern matching tool 200 shown in FIG. 2. It should be appreciated, however, that the operations illustrated in FIG. 3 may be employed by other implementations of a pattern matching tool according to various embodiments of the invention. Likewise, it should be appreciated that the pattern matching tool 200 shown in FIG. 2 may be used to perform methods according to various embodiments of the invention different from those specifically described by the flowchart of FIG. 3.

Also, it should be appreciated that various embodiments of the invention may be implemented by a system comprising one or more processors programmed to perform the operations described in FIG. 3. Still further, various embodiments of the invention may be implemented by processor-executable instructions, stored in a processor-readable medium, for causing one or more processors to perform the operations described in FIG. 3.

The flow illustrated in FIG. 3 starts with operation 310, where the pattern matching tool 200 receives a reference pattern (alternately referred to herein as a "library" pattern, as various implementations of the invention may obtain a reference pattern from a library of such patterns). As previously noted, the reference pattern may be supplied by a user or generated by the pattern library generation module 210. With some implementations of the invention, the pattern library generation module 210 can be configured to perform manufacturing process simulations, employ failure analysis results, or use data from other verification processes to identify problematic topological configurations. Process simulations, for example, can identify hotspots in a particular design, i.e., the features or configurations that will likely fail or negatively impact yield during manufacturing due to a variety of issues including, for example, optical resolution, lithographic variation, planarity variation, or high sensitivity to random defects. Failure analysis, on the other hand, uses silicon testing and yield analysis techniques to identify and isolate systematic defects that appear repetitively across dies and designs. Once a systematic issue related to a particular design feature or configuration is identified and characterized by the pattern library module 210, the particular design feature or configuration can be added to a pattern library as a library pattern for pattern matching purposes. The pattern library may be stored in the pattern database 215.

Figure 4:
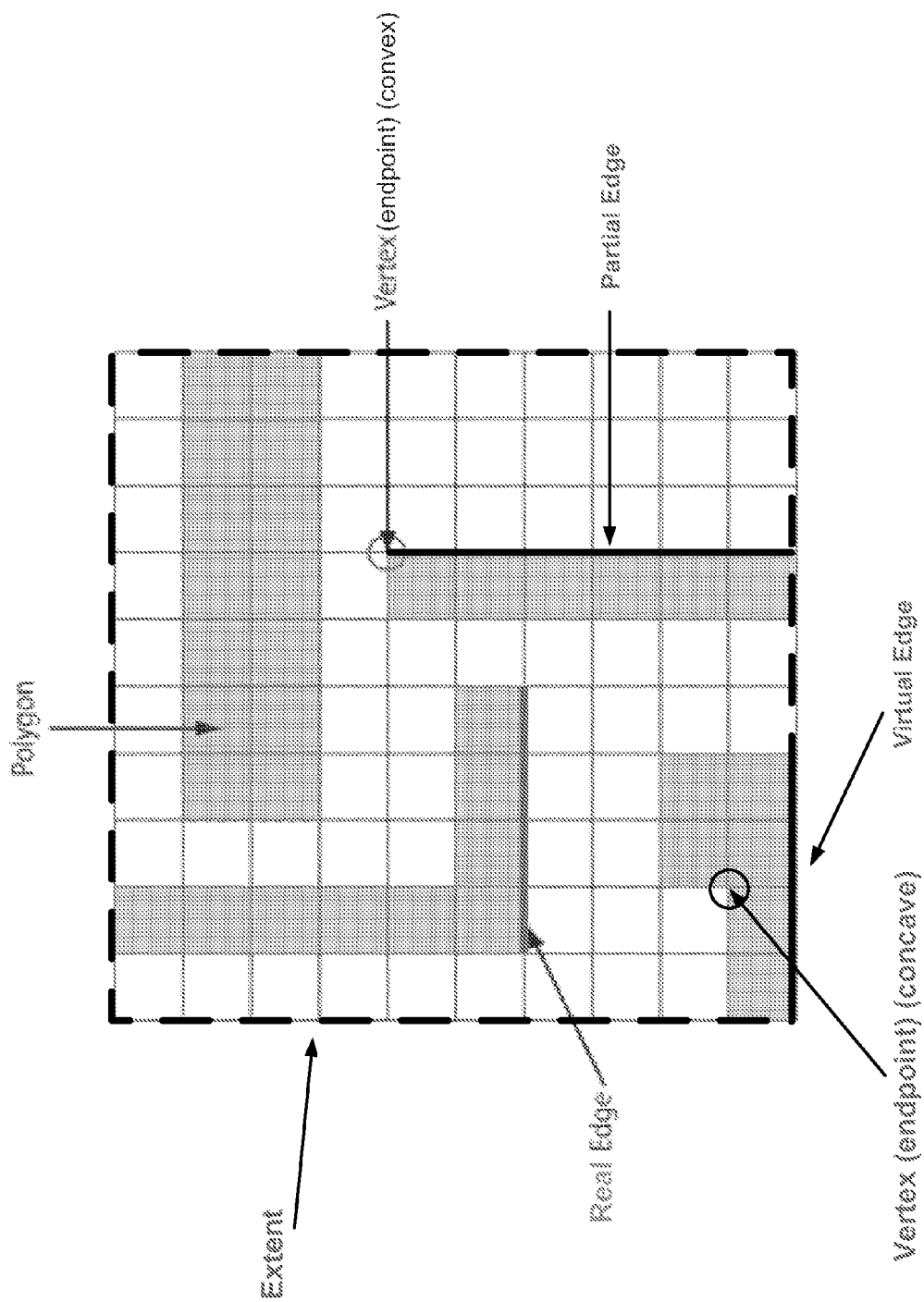
FIG. 4 illustrates some basic elements of a pattern.

Patterns in a pattern library may be described in various ways. A format called Pattern Description Language (PDL) used by the Calibre family of software tools available from Mentor Graphics Corporation of Wilsonville, Oreg., for example, may be employed. FIG. 4 provides an illustration of some basic elements of a pattern. A pattern usually contains a set of geometric elements such as polygons. A polygon is formed by a set of edges. Each edge has two endpoints (vertices of the polygon) which can be concave or convex. A concave endpoint is an endpoint that has two edges separated by an angle of less than 180° (e.g., 90°) with respect to the inside of a polygon when traversing the polygon edges in a counter-clockwise manner. A convex endpoint is an endpoint that has two edges separated by an angle of more than 180° (e.g., 270°) with respect to the inside of a polygon when traversing the polygon edges in a counter-clockwise manner.

A reference pattern search portion may be used to define the boundary of the design pattern in the layout design that will be compared with the reference pattern. With various implementations of the invention, the reference pattern search portion may be the entirety of the reference pattern, as illustrated in FIG. 4. Still other implementations of the invention may allow the reference pattern search portion to be only a subset of the reference pattern. With some of these implementations, the reference pattern search portion may be specified by, e.g., a user. Alternately or additionally, the reference pattern search portion may be selected based upon, for example, the number of anchor matching edges in a search window area. (For example, a large number of anchor matching edges may require employing a smaller reference pattern search portion in order to search a search window area in a desired amount of time.) As noted before, the boundary of the reference pattern search portion is referred to as the extent of the reference pattern search portion. The boundary of the design pattern is also referred to as the extent of the design pattern.

In accordance with their relationship with respect to the reference pattern search portion, edges in a design pattern may be categorized into three classes. A real edge is an edge of which the two endpoints lie inside the boundary of the design pattern defined by the reference pattern search portion. A partial edge is an edge having at least one portion lying outside the boundary of the design pattern defined by the reference pattern search portion. When an edge is effectively created by the boundary of the design pattern defined by the reference pattern search portion, the edge is a virtual edge. Edges can also be fixed or variable, as some implementations of the invention may allow the positions and/or endpoints of one or more of the edges to shift within certain ranges.

According to various embodiments of the invention, pattern matching may be performed for a search window area of a layout design. The search window area may be only a small part of a layout design. Typically, the search window area will have a rectangular shape, but any desired shape (including an irregular shape) may be employed. In operation 320, the anchor selection module 220 identifies an anchor edge based on information related to anchor matching edges found in the search window area. With various implementations of the invention, an edge in the reference pattern having the fewest number of matches in the tile is chosen as the anchor edge. This produces the shortest possible list of match candidates in the search window area, thus minimizing the number of candidates for the subsequent operations of pattern matching.

With various implementations of the invention, the anchor edge may be selected from a region of the reference pattern within the reference pattern search portion. With still other implementations of the invention, however, if the reference pattern search portion is a subset of the reference pattern, then the anchor selection module 220 may select an anchor edge outside of the reference pattern search portion. With these implementations, the boundary of the design pattern defined by the reference pattern search portion will still be positioned relative to the matching anchor edge, as will be discussed in more detail below.

Typically, different search window areas will have different sets of geometric elements, and thus different numbers of matching edges for any given edge in a reference pattern. Accordingly, with various embodiments of the invention, one edge in a reference pattern may be chosen as the anchor edge for one search window area, while another edge in a reference pattern may be chosen as the anchor edge for another tile. Thus, the anchor edge selection process may be dynamic.

In some embodiments of the invention, the anchor selection module 220 first sorts edges (or layout edges) in a search window area (or a tile) by endpoint type (concave or convex) and then by length (e.g. longest to shortest). For each anchor edge candidate (any real edge in the reference pattern), the anchor selection module 220 may determine which and how many layout edges in the tile match it. Being sorted by endpoint type and by length, all of those layout edges that match a specific anchor edge candidate are in one contiguous group. Since pattern matching is not orientation-specific, all 8 orientation variations (0, 90, 180, 270 degrees and their mirror images) are included in one group and are referred to as the matching layout edges of one anchor edge candidate. By recording the number of matching layout edges for each real edge of the library pattern, an anchor edge may be easily selected. For example, the anchor selection module 220 may be configured to choose the anchor edge candidate with the fewest number of matching layout edges as the anchor edge. The corresponding matching layout edges are referred to as anchor matching edges. If the fewest number for any anchor edge candidate is zero, the pattern matching tool 200 will stop the whole process for the tile, since there cannot be any matches. Once the anchor edge has been established for a particular tile, the anchor selection module 220 may select one endpoint of the anchor edge as the anchor point. The coordinates of all objects such as vertices (endpoints) in the library pattern may be stored relative to the anchor point for use in the next operation.

In some other embodiments of the invention, the anchor selection module 220 may select a pseudo edge as an anchor edge. Rather than choosing from existing edges of a library pattern, the module 220 uses two vertices without an edge connecting them to "create" an anchor edge (pseudo anchor edge). For example, two vertices of a library pattern that are far apart may be selected as endpoints of the pseudo anchor edge. The pseudo anchor edge's long length and may be other properties such as its relationship with some objects in the library pattern may lead to a small number of matches in a tile of a layout design.

In operation 330, the pattern matching module 240 traverses the anchor matching edges to determine which design pattern associated with the anchor matching edges match the library pattern or the reference pattern search portion. For each anchor matching edge, the pattern matching module 240, with various implementations of the invention, uses the extent of the reference pattern search portion to defined the extent of the design pattern associated with the each anchor matching edge in the tile according to the position and orientation of the matching layout edge and collects all edges that are in the extent of the design pattern and intersect with the extent. For edges extending beyond the extent, the module 240 may clip those edges at the extent boundary and create virtual edges. The placed extent defines a layout pattern to be matched with the library pattern. For each anchor matching edge, there may be two different placements of the extent. In those case, two design patterns may be derived for pattern matching Once the layout pattern is prepared, the module 240 may do a direct edge count comparison between the search pattern and the library pattern. If they are different, then there is no match in the location and the module 240 moves on to find the next layout pattern using another anchor matching edge. Otherwise, the module 240 continues the detailed pattern matching process. In some embodiments of the invention, the coordinates of all vertices in both the library pattern and the layout pattern may then be compared.

If there are variable edges in the library pattern, all the fixed vertices may be matched first. If successful, each variable vertex in the library pattern can move around in a rectangle determined by its allowable range.

It should be appreciated that various improvements may be adopted. For example, in addition to the anchor edge (called primary anchor edge here), one or more additional edges (the secondary edges) may be used to reduce the number of layout patterns for pattern matching. This is because a layout pattern that matches the library pattern must have edges matching both the primary and secondary edges. A secondary edge may be selected to have a unique spatial relationship to the primary anchor edge to further reduce the length of the anchor match list.

In the last operation 340 of the flowchart, the output module 260 delivers pattern matching results, which may be stored in the invention matching pattern database 265 for further processes such as simulation and/or measurements. In some embodiments of the invention, the output module 260 places a marker near the anchor edge of the layout pattern that matches the library pattern on an output layer (matching layout pattern). The marker may be user-specified or a rectangle that is a 90% shrink of the pattern's extent. Here, the output layer is a type of derived layers. With various examples of the invention, layout design data may include two different types of data: "drawn layer" design data and "derived layer" design data. The drawn layer data described geometric elements that will be used to form structures in layers of materials to produce the integrated circuit. The derived layers will include features made up of combinations of drawn layer data and other derived layer data.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes. While only one library pattern is used to illustrate the flowchart in FIG. 3, each operation in the flowchart can work with a set of library patterns simultaneously. In operation 320, for example, the anchor selection module can determine for a given tile of a layout design an anchor edge for each library pattern in the set. The computational cost of sorting the layout edges is amortized over all patterns being matched.

The invention claimed is:

1. A method of pattern matching, comprising:
   receiving data for a reference pattern and a layout design, the reference pattern having a reference pattern search portion;
   selecting an anchor edge for the reference pattern search portion based on information of a search window area in the layout design;
   searching for design patterns in the search window area that match the reference pattern search portion using anchor matching edges, the anchor matching edges being edges in the search window area that match the anchor edge; and
   storing information derived from the searching in a processor-readable medium.

2. The method recited in claim 1, wherein the reference pattern has fixed and variable edges.

3. The method recited in claim 1, wherein the reference pattern has only fixed edges.

4. The method recited in claim 1, wherein edges of the reference pattern are arranged in an array sorted by length and by endpoint type.

5. The method recited in claim 1, wherein the reference pattern search portion is defined by a user.

6. The method recited in claim 1, wherein the information of a search window area comprises numbers of matching edges in the search window area for edges in the reference pattern search portion.

7. The method recited in claim 1, wherein the anchor edge is a pseudo edge and the anchor matching edges are pseudo anchor matching edges.

8. The method recited in claim 1, wherein the selecting an anchor edge comprises:
   sorting edges in the search window area by length and by endpoint type;
   determining numbers of matching edges in the search window area for edges in the reference pattern search portion; and
   designating an edge in the reference pattern search portion with a fewest number of matching edges in the search window area as an anchor edge.

9. The method recited in claim 8, wherein the selecting an anchor edge further comprises:

designating an endpoint of the anchor edge as an anchor point; and determining coordinates of geometric elements in the reference pattern search portion relative to the anchor point.

10. The method recited in claim 1, further comprising: designating a second edge of the reference pattern search portion as a secondary edge.

11. The method recited in claim 1, wherein the searching for design patterns comprises:

designating a matching edge in the search window area that matches the anchor edge as an anchor matching edge;

define a design pattern in the search window area based on location and orientation of the anchor matching edge and the reference pattern search portion; and determining whether the design pattern matches the reference pattern search portion.

12. The method recited in claim 11, wherein the determining comprises:

comparing edge counts for edges in the reference pattern search portion with edge counts for corresponding matching edges in the design pattern.

13. The method recited in claim 12, wherein the determining further comprises:

determining coordinates of geometric elements in the design pattern relative to one of the endpoints of the anchor matching edge.

14. A processor-readable medium storing processor-executable instructions for causing one or more processors to perform a method of pattern matching, the method comprising:

receiving data for a reference pattern and a layout design, the reference pattern having a reference pattern search portion;

selecting an anchor edge for the reference pattern search portion based on information of a search window area in the layout design;

searching for design patterns in the search window area that match the reference pattern search portion using anchor matching edges, the anchor matching edges being edges in the search window area that match the anchor edge; and storing information derived from the searching in a processor-readable medium.

15. The processor-readable medium recited in claim 14, wherein the information of a search window area comprises numbers of matching edges in the search window area for edges in the reference pattern search portion.

16. The processor-readable medium recited in claim 14, wherein the selecting an anchor edge comprises:

sorting edges in the search window area by length and by endpoint type;

determining numbers of matching edges in the search window area for edges in the reference pattern search portion; and designating an edge in the reference pattern search portion with a fewest number of matching edges in the search window area as an anchor edge.

17. The processor-readable medium recited in claim 14, further comprising:

designating a second edge of the reference pattern search portion as a secondary edge.

18. The processor-readable medium recited in claim 14, wherein the searching for design patterns comprises:

designating a matching edge in the search window area that matches the anchor edge as an anchor matching edge;

define a design pattern in the search window area based on location and orientation of the anchor matching edge and the reference pattern search portion; and determining whether the design pattern matches the reference pattern search portion.

19. The processor-readable medium recited in claim 18, the determining comprises:

comparing edge counts for edges in the reference pattern search portion with edge counts for corresponding matching edges in the design pattern.

20. A system comprising one or more processors, the one or more processors programmed to perform a method of pattern matching, the method comprising:

receiving data for a reference pattern and a layout design, the reference pattern having a reference pattern search portion;

selecting an anchor edge for the reference pattern search portion based on information of a search window area in the layout design;

searching for design patterns in the search window area that match the reference pattern search portion using anchor matching edges, the anchor matching edges being edges in the search window area that match the anchor edge; and storing information derived from the searching in a processor-readable medium.

* * * * *